United States Patent
Weissenberger

(10) Patent No.: US 7,002,343 B2
(45) Date of Patent: Feb. 21, 2006

(54) METHOD FOR DETERMINING A COMPENSATION SETTING FOR AN EDDY CURRENT FIELD

(75) Inventor: Volker Weissenberger, Möhrendorf (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 10/779,252

(22) Filed: Feb. 13, 2004

(65) Prior Publication Data

US 2004/0227513 A1    Nov. 18, 2004

(30) Foreign Application Priority Data

Feb. 13, 2003  (DE) ................................ 103 06 017

(51) Int. Cl.
*G01V 3/00* (2006.01)
(52) U.S. Cl. ..................... 324/309; 327/307
(58) Field of Classification Search ............... 324/313, 324/319, 309, 307, 300, 318, 322; 600/410
See application file for complete search history.

(56) References Cited

U.S. PATENT DOCUMENTS

| | | | |
|---|---|---|---|
| 4,978,919 A | * | 12/1990 | Hinks .......................... 324/313 |
| 5,451,877 A | | 9/1995 | Weissenberger ............ 324/322 |
| 6,025,715 A | | 2/2000 | King et al. .................. 327/309 |
| 6,335,620 B1 | | 1/2002 | Weissenberger ............ 324/307 |
| 6,437,566 B1 | * | 8/2002 | Heid ............................ 324/309 |
| 6,531,870 B2 | | 3/2003 | Heid et al. ................... 324/318 |

FOREIGN PATENT DOCUMENTS

EP          0 228 056        12/1986

* cited by examiner

*Primary Examiner*—Brij B. Shrivastav
(74) *Attorney, Agent, or Firm*—Schiff Hardin LLP

(57) ABSTRACT

In a method for determining a compensation setting for an eddy current field that is caused by a temporally variable gradient field of a magnetic resonance apparatus, at least two magnetic resonance data sets arising from different spatial positions are generated using the gradient field, and from the magnetic resonance data sets, the compensation setting of a filter is calculated, with which a control quantity of the gradient field can be pre-distorted, such that the sum from the gradient field and at least one component of the eddy current field exhibits a desired time curve, and the gradient field used for the magnetic resonance data sets is generated with a predetermined initial setting of the filter that at least approximately takes into account the component of the eddy current field.

12 Claims, 3 Drawing Sheets

METHOD FOR DETERMINING A COMPENSATION SETTING FOR AN EDDY CURRENT FIELD

BACKGROUND OF THE INVENTION

1. Field of the Invention

The present invention concerns a method for determining a compensation setting for an eddy current field.

2. Description of the Prior Art

Magnetic resonance technology is a known modality for acquiring images of the inside of a body of an examination subject. In a magnetic resonance device, rapidly switched gradient fields that are generated by a gradient coil system are superimposed on a static homogenous basic magnetic field that is generated by a basic field magnet. The magnetic resonance device also has a radio-frequency system that radiates radio-frequency signals into the examination subject to excite magnetic resonance signals and that acquires the generated magnetic resonance signals, on the basis of which magnetic resonance images are created.

A gradient coil of the gradient coil system generates a gradient field for a specific direction in space that, in the desirable ideal case, has (at least within an imaging volume) a field component that is collinear to the basic magnetic field. The field component has a predeterminable gradient that is spatially-independently, optimally of same magnitude at an arbitrary particular point in time, at least within the imaging volume. Since the gradient field is a temporally variable magnetic field, the aforementioned is true for each individual point in time, but the strength of the gradient is variable from one point in time to another point in time. To generate the gradient field, an appropriate current is adjusted (set) in the gradient coil. The amplitudes of the required currents amount to more than 100 A. The current rise and fall rates amount to more than 100 kA/s. For power supply, each gradient coil is connected to a gradient amplifiers.

The gradient coil system normally is surrounded by a conductive structure, and thus eddy currents are induced in this structure by the switched gradient fields. Examples of such conductive structures are a vacuum vessel and/or a cryoshield of a superconducting basic field magnet, a copper foil of a radio-frequency shielding, and the gradient coil system itself. The eddy current fields generated by the eddy currents are undesirable because without counteracting measures, they weaken the gradient fields and distort their time curves. This leads to an impairment of the quality of magnetic resonance images. This is also true for an actively shielded gradient coil system that has shielding coils associated with the gradient coils, whereby a quantitative reduction of eddy currents is achieved in comparison to the unshielded gradient coil systems.

The impairment of a gradient field as a result of the eddy current fields can be compensated to a certain degree by a corresponding pre-distortion of a quantity used to control the gradient field. To compensate, the control quantity is filtered such that eddy current fields ensuing given non-predistorted operation of the gradient coil are cancelled by the pre-distortion. The eddy current fields can be described in the form of a series expansion of a spherical function. To describe the temporal dependency of the eddy current field components, a temporally falling exponential function characterized by a time constant is associated with each coefficient of the spherical function in the series expansion. For filtering, a suitable filter can be used with parameters determined by the time constants and coefficients.

Filters employed as high-pass filters are known from European Application 0 228 056. To determine the parameters necessary for the filter, the eddy current field is first measured. A method is specified for this purpose wherein the magnetic field curve is measured by the magnetic resonance signals induced in a probe. Since measurement of the eddy current field is necessary at at least two locations of the imaging volume, the probe must be switched back and forth between two measurement positions for each measurement cycle. Since, in magnetic resonance devices, it is furthermore necessary in many cases to record the existing eddy current field in as large an area of the imaging volume as possible, the measurement with the probe is therefore extremely complicated, since the entire imaging volume must be scanned for complete recording of the eddy current field. This is particularly true when it is also desired to measure eddy current field portions of a higher order. An automated measurement is not possible using this known technique.

A method is described in U.S. Pat. No. 6,025,715 in which the eddy current compensation is begun with various sets of filter parameters, and then the remaining (residual) fields are respectively measured. An optimal compensation is determined via empirical interpolation of the dependency of the remaining fields on the filter parameters. A disadvantage of this method is that 53 measurements per gradient field are necessary, and thus the method takes a very long time.

A method to measure eddy current fields is known from German OS 43 13 392 in which a volume-occupying phantom (as it is also used for other test and setting purposes in magnetic resonance devices) is introduced into the examination space and data are acquired with a slice-selective magnetic resonance method. An eddy current compensation can thereby be implemented and checked fully automatically without special devices such as measurement probes. The operation of the method is simple since the phantom does not have to be moved for the measurement.

In an development of the method of German OS 43 13 392, a method based on magnetic resonance measurements is described in German PS 198 59 501 with which terms known as cross-terms additionally can be determined. A cross term is a field component of the eddy current field that is caused by the gradient field with a gradient in a first direction, the field component acting in a second direction that is perpendicular to the first. If the field component is a field component of the first order, the field component can be compensated by a counter-directed triggering of a gradient coil, with which a gradient field in the second direction can be generated. In this method, a volume-occupying phantom is brought into the imaging volume of the magnetic resonance device, a measurement gradient pulse of predeterminable pulse width is switched, and after the deactivation of the measurement gradient pulse at least two imaging sequence blocks, temporally separate from one another, are generated, from each of which imaging magnetic resonance signals are acquired from these signals a (at least) two-dimensional data set is generated, with the phase information contained in the magnetic resonance signals embodying characteristics (parameters) of the eddy current fields. The amplitudes and time constants of the eddy current field can be determined from these characteristics with a suitable evaluation method.

Furthermore, in magnetic resonance devices the use of shim coils is known, with which the basic magnetic field can be homogenized, for example dependent on different examination subjects. For this purpose, the shim coils are operated with suitable direct currents. Since linear basic magnetic field deviations (meaning interferences of the first order) can be compensated (by the gradient coils being charged with a direct current), the shim coils normally are fashioned such that precisely one interference of a specific order larger than the first order is compensated with one of the shim coils with the respective shim coils compensating for interferences of different orders greater than one. Moreover, it is known from previously cited German PS 198 59 501 that eddy current-caused interferences of a higher order additionally can be compensated by an additional pulsed current feed of the shim pulses.

The eddy currents and the eddy current compensation can be mathematically described as follows with reference to FIG. 1: a desired gradient pulse u(t) as an input signal (in the simplest case, a rectangular pulse as shown in FIG. 1) is predistorted by a eddy current compensation filter. The transfer function of the filter is K(t). The gradient amplifier generates a current proportional thereto. Assuming the amplification does not distort the signal shape, it does not have to be considered further in the mathematical description. The gradient coil now generates a gradient field g(t) as an output signal. Eddy currents in the surrounding electrically-conductive structures act in a counteracting manner and distort the pulse shape. The effect of the eddy currents can be described by a transfer function W(t). Given perfect eddy current compensation, the gradient field g(t) has the same pulse shape as the input signal u(t). by convolution of the input signal u(t) with the transfer functions K(t) and W(t), the gradient field g(t) mathematically yields:

$$g(t)=u(t)*K(t)*W(t)$$

After a Laplace transformation, the convolution operation becomes a simple multiplication:

$$\tilde{g}(s)=\tilde{u}(s)\tilde{K}(s)\tilde{W}(s)$$

The variable of the Laplace transformation is designated s, and the Laplace-transformed quantities are designated with " ~ " over the letters, with use of the same letters. For a perfect eddy current compensation, the output signal g(t) should correspond to the input signal u(t). The transfer function of the eddy current compensation filter K(t) thus results from the following equation:

$$\tilde{K}(s) = \frac{1}{\tilde{W}(s)}$$

According to the known method, the eddy current compensation ensues as follows: the eddy current compensation is initially disabled, thus $\tilde{K}(s)=1$. A stepped input signal u(t) is applied, for which the Laplace-transformed $\tilde{u}(s)=1/s$. An eddy current field g(t) that can be described as a sum of exponential functions arises as a reaction to this stepped input signal. The Laplace-transform $\tilde{g}(s)$ can be analytically or numerically calculated from this. The eddy current transfer function thus results as:

$$\tilde{W}(s) = \frac{\tilde{g}(s)}{\tilde{u}(s)} = s\tilde{g}(s),$$

and the desired transfer function of the eddy current compensation filter:

$$\tilde{K}(s) = \frac{1}{\tilde{W}(s)} = \frac{1}{s\tilde{g}(s)}$$

The filter parameters can be calculated from the filter transfer function.

Finally, a magnetic resonance device with a gradient coil system is known from German OS 101 56 770 in which an electrically-conductive structure is arranged and fashioned such that, at least within the imaging volume of the magnetic resonance device, a magnetic field of the structure caused by a gradient field due to induction effects is similar (in the geometric sense) to the gradient field. In an embodiment, at least one part of the structure is a barrel-shaped component of the basic field magnet. Among other things, an advantage achieved with this arrangement is that the gradient coil system can be fashioned without secondary coils, since the undesirable consequences of the switched gradient fields due to the geometric similarity of the magnetic field caused by the structure can be controlled by a pre-distortion.

SUMMARY OF THE INVENTION

It is an object of the present invention to provide an improved method for determining a compensation setting for an eddy current field.

The object is achieved according to the invention by a method for determining a compensation setting for an eddy current field that is caused by a temporally variable gradient field of a magnetic resonance device, wherein at least two magnetic resonance data sets arising from different spatial positions are generated using the gradient field, and from the magnetic resonance data sets, the compensation setting of a filter is calculated, with which a control quantity of the gradient field can be pre-distorted, such that the sum from the gradient field and at least one component of the eddy current field exhibits a desired time curve, and wherein the gradient field used for the magnetic resonance data sets is generated with a predetermined initial setting of the filter that at least approximately takes into account the component of the eddy current field.

The invention is based on the recognition that, for example, the methods corresponding to German OS 43 13 392 and German PS 198 59 501 assume that the eddy current field is not too large. The precision of these methods is based on the precision with which the eddy current field is measured. Given weak eddy current fields, this is very precise, whereas errors occur given eddy current fields with large amplitudes. If the eddy current field component amounts to approximately more than 10% of the gradient field triggering the eddy current field, these methods are problematic or impossible, since the amplitudes of the magnetic resonance signals are reduced, and the selective slice excitation that occurs in these methods is incorrect (faulty).

These methods, however, can be use made suitable for given strong eddy current fields, by the inventive method by virtue of the use of the initial setting, which a priori at least approximately compensates the eddy current field. These methods thus can be made suitable for use in a magnetic resonance device with gradient coils that have a poor active shielding or no shielding at all, for example for reasons of performance or cost. An example of a magnetic resonance device with nonactively-shielded gradient coil system is described in the previously cited German OS 101 56 770.

Because the eddy current field of a gradient coil is determined in large part by the structure (design) of the magnetic resonance device, and thus is in the same magnitude range in each magnetic resonance device of a specific class (model), the pre-compensation of the largest component of the eddy current field can ensue with approximate values that are the same for the specific class. The remaining smaller deviations, for example as a result of production tolerances of different cryoshield temperatures of superconducting basic field magnets, are then measured very precisely using the aforementioned methods in connection with the preset eddy current compensation, from which a corrected eddy current compensation is then determined.

DESCRIPTION OF THE PREFERRED EMBODIMENTS

Figure 1:
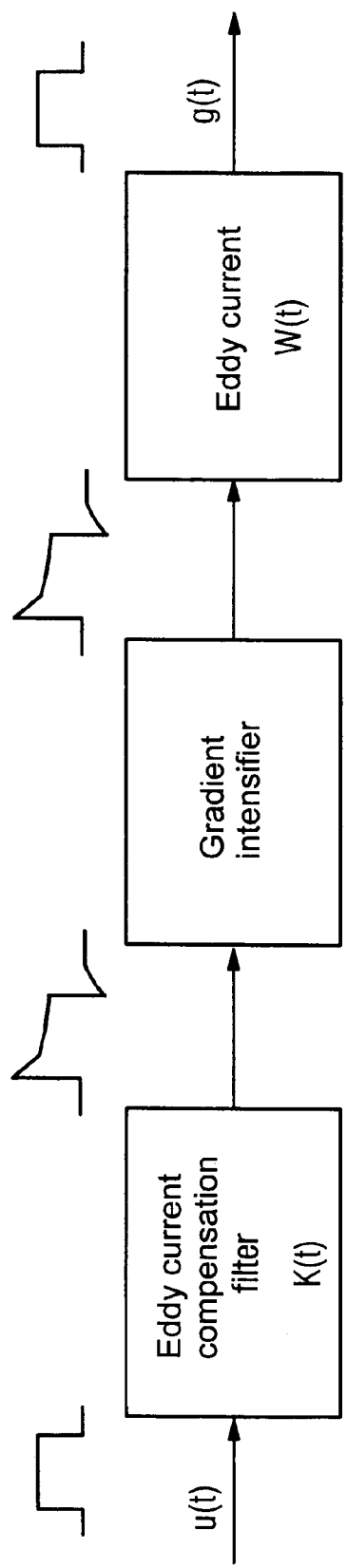
FIG. 1, as described above, is a block diagram to mathematically describe the basic steps for known eddy current compensation.
Figure 2:
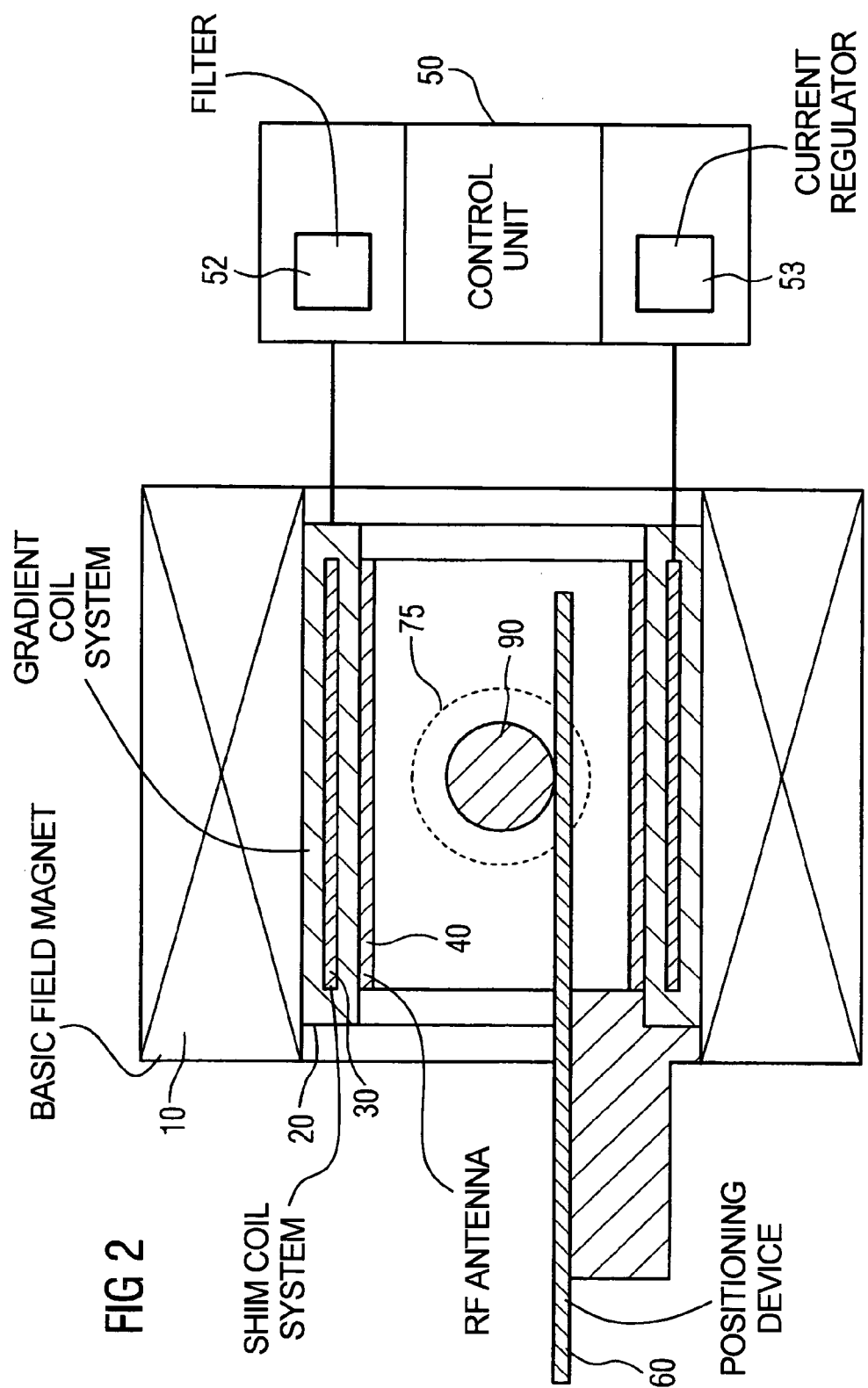
FIG. 2 is a longitudinal section through a magnetic resonance apparatus operable in accordance with the invention.

FIG. 2 shows a longitudinal section through a magnetic resonance apparatus. To generate a static basic magnetic field that is optimally homogenous at least within a spherical imaging volume 75, the magnetic resonance apparatus has a substantially hollow-cylindrical superconducting basic field magnet 10. Furthermore, to generate rapidly switchable magnetic gradient fields that are optimally linear within the imaging volume 75, the magnetic resonance device has a gradient coil system 20, likewise substantially hollow-cylindrical, that is arranged in the bore of the basic field magnet 10. A shim coil system 30 with which, among other things, the basic magnetic field can be homogenized within the imaging volume 75, is integrated into the gradient coil system 20.

The gradient coils of the gradient coil system 20 and the shim coils of the shim coil system 30 are connected for power supply to a control unit 50. The control unit 50 has a filter 52 with adjustable filter parameters to pre-distort the gradient coil currents. Furthermore, the control unit 50 has a likewise adjustable current regulator 53 to adjust temporally variable shim coil currents for purposes of compensation of eddy current field portions.

Furthermore, arranged in the hollow of the gradient coil system 20 is an antenna 40 (likewise substantially hollow-cylindrical) with which, to excite magnetic resonance signals, radio-frequency signals can be radiated into an examination subject positioned at least partially in the imaging volume 75, and with which the generated magnetic resonance signals can be acquired. In order to introduce the examination subject (for example a patient) into the examination space, and to position a region of the patient to be imaged in the imaging volume 75, the magnetic resonance apparatus has a mobile positioning device 60 with which the patient lying thereon can be inserted into the examination space and the region to be imaged can be positioned in the imaging volume 75.

In the following, the method to determine the compensation setting is explained in detail with reference to the magnetic resonance device of FIG. 2. After the set-up of the magnetic resonance device at its place of installation, a start-up of the magnetic resonance device is implemented. The start-up includes, among other things, determination of default (set) values for the filter 52 and current regulator 53, such that undesired effects of eddy current fields that are substantially caused by the switched gradient fields can be compensated in an image acquisition procedure.

For the settings of the filter 52 and current regulator 53, initial settings are that, on average for the class, lead to a reasonable compensation of eddy current fields of the magnetic resonance apparatus in question dependent on the class of the magnetic resonance device. These initial settings are stored in a non-volatile memory of the magnetic resonance device or a computer program of the magnetic resonance device. Due to production tolerances within the class and/or due to different temperatures in the cryoshield (if present) of the basic field magnet 10, the compensation still exhibits residual errors that are then corrected with a subsequent procedure.

For this, a volume-occupying phantom 90, for example a spherical water phantom, is centered (for example according to the previously cited German PS 198 59 501, and at least one gradient pulse of a predetermined pulse width is switched. At least two imaging sequence blocks, temporally separate from one another, are thereupon executed for two different slices of the phantom 90 with the initial settings for the filter 52 and the current regulator 53. From the resulting magnetic resonance signals of the phantom 90 an at least two-dimensional data set is generated that represents an image of the phantom 90. From characteristic quantities (parameters) of the eddy current field that are present in the phase information contained in the magnetic resonance signals, the compensation settings for the filter 52 and the current regulator 53 are precisely determined, stored and used for the later imagings in place of the initial settings.

Starting from the mathematical description given above, the inventive method based on initial settings can be mathematically described as follows: in a manner differing from in the earlier mathematical description, a compensation filter $\tilde{K}_0(s)$ is provided with initial settings. From this, a gradient field $g_0(t)$ results that still exhibits only slight residual errors:

$$\tilde{g}_0(s) = \tilde{u}(s)\tilde{K}_0(s)\tilde{W}(s)$$

From this, the correct eddy current compensation can then be calculated:

$$\tilde{K}(s) = \frac{1}{\tilde{W}(s)} = \frac{\tilde{u}(s)\tilde{K}_0(s)}{\tilde{g}_0(s)} = \frac{\tilde{K}_0(s)}{s\tilde{g}_0(s)}$$

The method is illustrated in the following example with an eddy current time constant. It is assumed that the eddy current field can be described by an exponential function with a time constant. The time curve and the associated Laplace-transform are then:

$$W(t) = (1 - a_w)\delta(t) + \frac{a_w}{\tau_w}\exp\left(-\frac{t}{\tau_w}\right) \Rightarrow \tilde{W}(s) = 1 - a_w + \frac{a_w}{s\tau_w + 1}$$

The approximate compensation then has only one time constant:

$$K_0(t) = (1+a_{k0})\delta(t) + \frac{a_{k0}}{\tau_{k0}}\exp\left(-\frac{t}{\tau_{k0}}\right) \Rightarrow \tilde{K}_0(s) = 1 + a_{k0} - \frac{a_{k0}}{s\tau_{k0}+1}$$

Given a stepped gradient pulse described by a step function $$u(t) = \sigma(t) \Rightarrow \tilde{u}(s) = \frac{1}{s},$$

the following gradient field is obtained in the Laplace space:

$$\tilde{g}_0(s) = \tilde{u}(s)\tilde{K}_0(s)\tilde{W}(s) = \frac{1}{s}\left[1 + a_{k0} - \frac{a_{k0}}{s\tau_{k0}+1}\right]\left[1 - a_w - \frac{a_w}{s\tau_w+1}\right],$$

and the following time curve after inverse Laplace transformation:

$$g_0(t) = 1 - \frac{a_w(a_{k0}\tau_{k0}+\tau_{k0}-\tau_w)}{\tau_{k0}-\tau_w}\exp\left(\frac{-t}{\tau_{k0}}\right) + \frac{a_{k0}(a_w\tau_w+\tau_{k0}-\tau_w)}{\tau_{k0}-\tau_w}\exp\left(\frac{-t}{\tau_w}\right)$$

Figure 3:
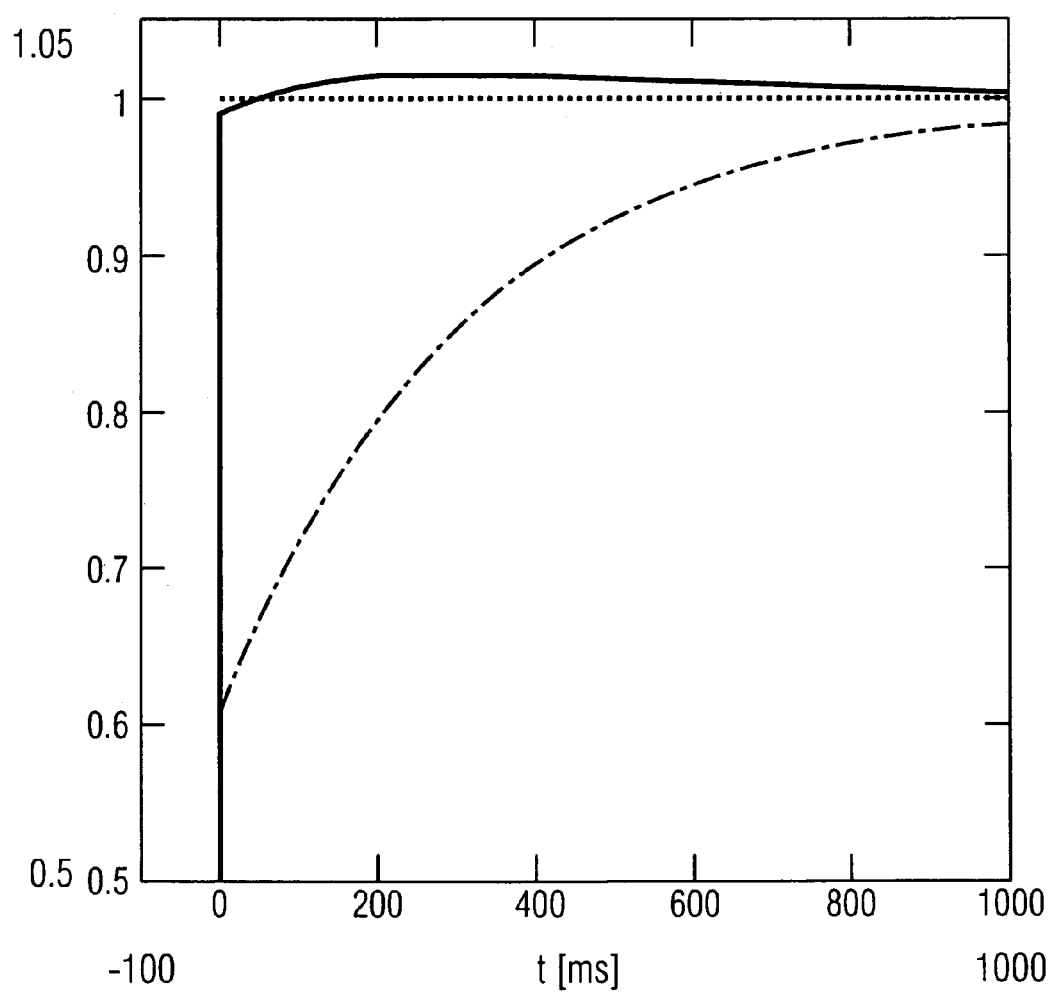
FIG. 3 illustrates various gradient field time curves for explaining the invention.

Simulated gradient field time curves are shown in FIG. 3. The dotted curve corresponds to the ideal gradient step function. The dash-dot curve results under the assumption of a 40% eddy current component and a time constant of 300 ms without initial settings for the eddy current compensation, meaning with filter parameters equal to zero. For the same eddy current property as in the dash-dot curve, the solid-line curve arises with actuated eddy current compensation with initial parameters of 65% and 200 ms that compensate up to a few percent, whereby 66.6% and 180 ms would be correct.

The partially compensated solid-line curve can now be very precisely measured as $g_0(t)$ and be used after Laplace transformation in the following formula:

$$\tilde{K}(s) = \frac{\tilde{K}_0(s)}{s\tilde{g}_0(s)} = \frac{1}{\left[1 - a_w - \frac{a_w}{s\tau_w+1}\right]}$$

The expected result is therewith obtained:

$$K(t) = \frac{1}{1-a_w}\delta(t) - \frac{a_w}{(1-a_w)\tau_w(1-a_w)}\exp\left[-\frac{t}{\tau_w(1-a_w)}\right]$$

The correct amplitudes and time constants of the eddy current compensation are then:

$$a_k = \frac{a_w}{1-a_w} \quad \tau_k = \tau_w(1-a_w)$$

The preceding description can be expanded to a sum of exponential functions.

The inventive method is suited not only for the initial determination of an eddy current compensation in the start-up, but also enables an existing eddy current compensation to be improved. This can be necessary, for example, when the temperature of the cryoshield of a superconducting basic field magnet, and thus the time constants, change.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for determining a setting for compensating an eddy current field caused by a temporally variable gradient field in a magnetic resonance apparatus, comprising the steps of:

generating a gradient field in a magnetic resonance apparatus using an eddy current compensation filter and setting said eddy current compensation filter to an initial setting that at least approximately counts for a component of an eddy current field expected to arise in said magnetic resonance apparatus due to said gradient field;

using said gradient field, obtaining at least two preliminary magnetic resonance data sets respectively arising from different spatial positions in the magnetic resonance apparatus, with said eddy current field being inexactly compensated due to said initial setting;

from said magnetic resonance data sets, calculating a compensation setting for said eddy current compensation filter for more exactly compensating said eddy current field that causes a sum of the gradient field and said at least one component of the eddy current field to exhibit a selected time curve; and obtaining a diagnostic magnetic resonance data set by generating said gradient field with said filter at said compensation.

2. A method as claimed in claim 1 comprising generating said gradient field with a gradient coil of the magnetic resonance apparatus.

3. A method as claimed in claim 1 wherein said component of said eddy current field comprises first order terms, including cross-terms, of a series expansion of a spherical function representing said eddy current field.

4. A method as claimed in claim 1 comprising compensating for at least one further component of said eddy current field using a correction device to generate a correction magnetic field in said magnetic resonance apparatus.

5. A method as claimed in claim 4 wherein said eddy current field is representable as a series expansion of a spherical function, with respective components of said eddy current field being represented by orders greater than one in said series expansion, and comprising generating said correction magnetic field with said correction device to compensate for a component of said eddy current field having one of said orders greater than one.

6. A method as claimed in claim 5 comprising generating a compensation setting for said correction device dependent on the compensation setting of said filter.

7. A method as claimed in claim 4 comprising generating said correction magnetic field with a predetermined initial setting of said correction device that at least approximately compensates a majority of the eddy current field.

8. A method as claimed in claim 4 wherein said magnetic resonance apparatus includes a shim coil for shimming a static magnetic field of said magnetic resonance apparatus, and comprising employing, as said correction device, a coil selected from the group consisting of a correction coil and said shim coil.

9. A method as claimed in claim 1 comprising storing said initial setting in a storage location selected from the group consisting of a memory and a computer program for operating said magnetic resonance apparatus.

10. A method as claimed in claim 1 wherein said magnetic resonance apparatus is in an apparatus class, and comprising employing an initial setting that is an initial setting for all magnetic resonance apparatuses in said apparatus class.

11. A method as claimed in claim 1 comprising employing a phantom disposed in said magnetic resonance apparatus to generate said at least two magnetic resonance data sets.

12. A method as claimed in claim 11 comprising generating said at least two magnetic resonance data sets as two-dimensional data sets by a slice-selective excitation of said phantom.

* * * * *